United States Patent [19]

Kumagai et al.

[11] Patent Number: 5,324,975
[45] Date of Patent: * Jun. 28, 1994

[54] SEMICONDUCTOR MEMORY DEVICE

[75] Inventors: Jumpei Kumagai; Shizuo Sawada, both of Yokohama, Japan

[73] Assignee: Kabushiki Kaisha Toshiba, Kawasaki, Japan

[*] Notice: The portion of the term of this patent subsequent to Mar. 16, 2010 has been disclaimed.

[21] Appl. No.: 4,303

[22] Filed: Jan. 14, 1993

Related U.S. Application Data

[60] Division of Ser. No. 813,049, Dec. 23, 1991, Pat. No. 5,194,752, which is a continuation of Ser. No. 527,377, May 23, 1990, abandoned.

[30] Foreign Application Priority Data

May 23, 1989 [JP] Japan .................................. 1-129916

[51] Int. Cl.$^5$ ...................... H01L 23/48; H01L 29/40; H01L 29/44; H01L 29/52
[52] U.S. Cl. ........................................ 257/382; 257/390
[58] Field of Search ................................ 257/382, 390

[56] References Cited

U.S. PATENT DOCUMENTS

| | | | |
|---|---|---|---|
| 4,125,854 | 11/1978 | McKenny et al. | 357/41 |
| 4,291,391 | 9/1981 | Chatterjee et al. | 365/184 |
| 4,460,911 | 7/1984 | Salters | 357/23.6 |
| 4,476,547 | 10/1984 | Miyasaka | 357/23.6 |
| 4,649,406 | 3/1987 | Takemae et al. | 357/23.6 |
| 4,700,328 | 10/1987 | Burghard | 361/51 |
| 4,710,897 | 12/1987 | Masuoka et al. | 365/182 |
| 4,941,031 | 7/1990 | Kumagai et al. | 357/45 |

FOREIGN PATENT DOCUMENTS

| | | |
|---|---|---|
| 0055572 | 7/1982 | European Pat. Off. |
| 61-274357 | 12/1986 | Japan |
| 63-278363 | 11/1988 | Japan |
| 64-80068 | 3/1989 | Japan |

OTHER PUBLICATIONS

Kimura et al., "A New Stacked Capacitor DRAM Cell Characterized by a Storage Capacitor on a Bit-line Structure", International Electron Devices Meeting (San Francisco, CA. Dec. 11-14, 1988) at 596-99.

Aoki et al., "A 1.5V DRAM for Battery-Based Applications", IEEE Int'l Solid-State Circuits Conf. (Feb. 17, 1989) at 238-40.

Primary Examiner—Andrew J. James
Assistant Examiner—Stephen D. Meier
Attorney, Agent, or Firm—Banner, Birch, McKie & Beckett

[57] ABSTRACT

For increasing pattern density of cell regions in a semiconductor memory device including an array of dynamic memory cells, the cell regions for cell transistor pairs are provided in a semiconductor substrate so as to be crossed by one desired bit line and two word lines adjacent thereto, and the patterns of cell regions have a same direction. Contacts for electrically connecting each bit line to common regions of cell transistor pairs are provided on respective bit lines every desired pitch at positions where each bit line intersects with cell regions. These contacts of adjacent bit lines are successively shifted in a bit line direction by approximately $\frac{1}{2^n}$ (n is natural numbers greater than or equal to 2) pitch.

6 Claims, 8 Drawing Sheets

SEMICONDUCTOR MEMORY DEVICE

This application is a division, of application Ser. No. 07/813,049, filed Dec. 23, 1991, now U.S. Pat. No. 5,194,752, which is a continuation of application Ser. No. 07/527,377, filed May 23, 1990, abandoned.

BACKGROUND OF THE INVENTION

1. Field of the Invention

This invention relates to a semiconductor memory device, and more particularly to a cell array pattern in one-transistor-one-capacitor type dynamic memory cells.

2. Description of the Related Art

As an arrangement of a dynamic memory cell with a one-transistor-one-capacitor structure in a dynamic memory, various patterns have been proposed to increase the integration density thereof. FIG. 8 schematically shows an example of a conventional cell array pattern of folded bit line type. In FIG. 8, 61 denotes bit lines arranged in parallel with one another, and 62 denotes bit line sense amplifiers arranged on both sides of the bit lines 61. Adjacent two of the bit lines 61 make one complementary pair and are connected to a corresponding one of the bit line sense amplifiers 62. Each of the bit lines 61 has contacts or connection members 63 which are in contact with drain regions (or source regions) of memory cell transistors (charge transfer transistors) at desired pitch P in a longitudinal direction thereof. In this case, if desired two bit lines adjacent to each other are noted, a position of a transistor contact 63 in one bit line 61 is deviated by ½ pitch in the bit line direction from a position of a transistor contact 63 of an adjacent bit line 61.

FIG. 9 shows part of the cell array pattern of FIG. 8 in detail. In FIG. 9, 61 denotes bit lines, 63 bit line contacts, 71a cell regions having a pattern extending diagonally right and upward, and 71b cell regions having a pattern extending diagonally right and downward, respectively. The two kinds of cell region patterns are alternately arranged every ½ pitch in the bit line direction. Further, 72 denotes word lines which are also used as gate electrodes of the cell transistors, 73 denotes capacitor storage electrodes provided for every memory cell, and 74 contacts (capacitor contacts) for connecting source regions 43 or 44 of cell transistors to the capacitor storage electrodes 73, respectively.

The cell regions 71a and 71b have a cross-sectional structure as shown in FIG. 4. In FIG. 4, 41 denotes a semiconductor substrate, 42 denotes a field insulating film for cell isolation selectively formed in the semiconductor substrate 41, 43 and 44 denote source regions of first and second cell transistors which are formed of diffused regions of a conductivity type opposite to that of the semiconductor substrate, 45 denotes a common drain region of the first and second cell transistors which is formed of a diffused region of a conductivity type opposite to that of the semiconductor substrate, and 46 and 47 denote the gate electrodes of the first and second cell transistors which are provided through a thin insulating film 48 above the semiconductor substrate 41 and used as part of the word lines 72. Further, 49 denotes a first interlevel insulator, 61 denotes the bit lines, 63 denotes the transistor contact which is in contact with the drain region 45 through a contact hole. 72 denotes the word lines and 50 denotes a second interlevel insulator.

The first and second cell transistors include a charge storage capacitor, respectively. That is, capacitor storage electrodes denoted by 73 are partly disposed on the second interlevel insulator 50 so as to be located above part of the upper portion of the bit lines 61, and are in contact with the source regions 43 and 44 of the cell transistors via contact holes, respectively. A capacitor plate electrode 52 is provided so that the capacitor storage electrodes 73 are faced through a thin capacitor insulating film 51, thereby providing a stacked capacitor.

In the above cell array pattern, the bit lines 61 and the word lines 72 are arranged in respective directions to intersect with each other, the cell region 71a or 71b for two cell transistors is provided to be crossed by one of the bit lines 61 and adjacent two of the word lines 72, respectively, each bit line 61 is in contact with the common region of the two cell transistors at the portion intersecting the bit line 61 and the cell region 71a or 71b, the capacitors are connected to the two cell transistors, and the cell regions 71a and 71b are provided with patterns which are inclined in the right-upward and right-downward directions, respectively, and are alternately arranged every ½ pitch in the bit line direction.

However, when the cell regions 71a and 71b are provided in this way, it is difficult to increase the integration density of the cell regions. That is, as shown in FIG. 9, the integration density of the cell regions is determined by the minimum distance d0 between the adjacent two patterns having different directions. The minimum distance dx between the adjacent two patterns having the same directions has a large space as compared to the minimum distance d0, thereby creating a uselessly unoccupied area.

As described above, since the conventional dynamic memory cells are provided by alternately arranging two kinds of patterns every ½ pitch as the cell regions, it is difficult to increase the integration density of cell regions.

SUMMARY OF THE INVENTION

Accordingly, an object of this invention is to provide a semiconductor memory device in which the pattern density of cell regions in cell array patterns of dynamic memory cell arrays is increased.

In a semiconductor memory device having one-transistor-one-capacitor type dynamic memory cells according to the invention, cell regions for cell transistor pairs are provided in a semiconductor substrate so as to be crossed by one bit line and two adjacent word lines, respectively, and the patterns of the cell regions have the same direction. Contacts are provided for electrically connecting respective bit lines and common regions of cell transistor pairs to one another at portions where the cell regions intersect with the bit lines every desired pitch in the bit line direction. In this case, a distance between adjacent two contacts of a desired bit line is given as one pitch, and the contacts of the adjacent bit lines are shifted in the bit line direction by approximately $\frac{1}{2^n}$ pitch (n is natural numbers greater than or equal to 2).

BRIEF DESCRIPTION OF THE DRAWINGS

The novel and distinctive features of the invention are set forth in the claims appended to the present application. The invention itself, however, together with further objects and advantages thereof may best be understood by reference to the following description and accompanying drawings in which:

DETAILED DESCRIPTION OF THE PREFERRED EMBODIMENT

There will now be described one embodiment of the invention with reference to the accompanying drawings.

Figure 1:
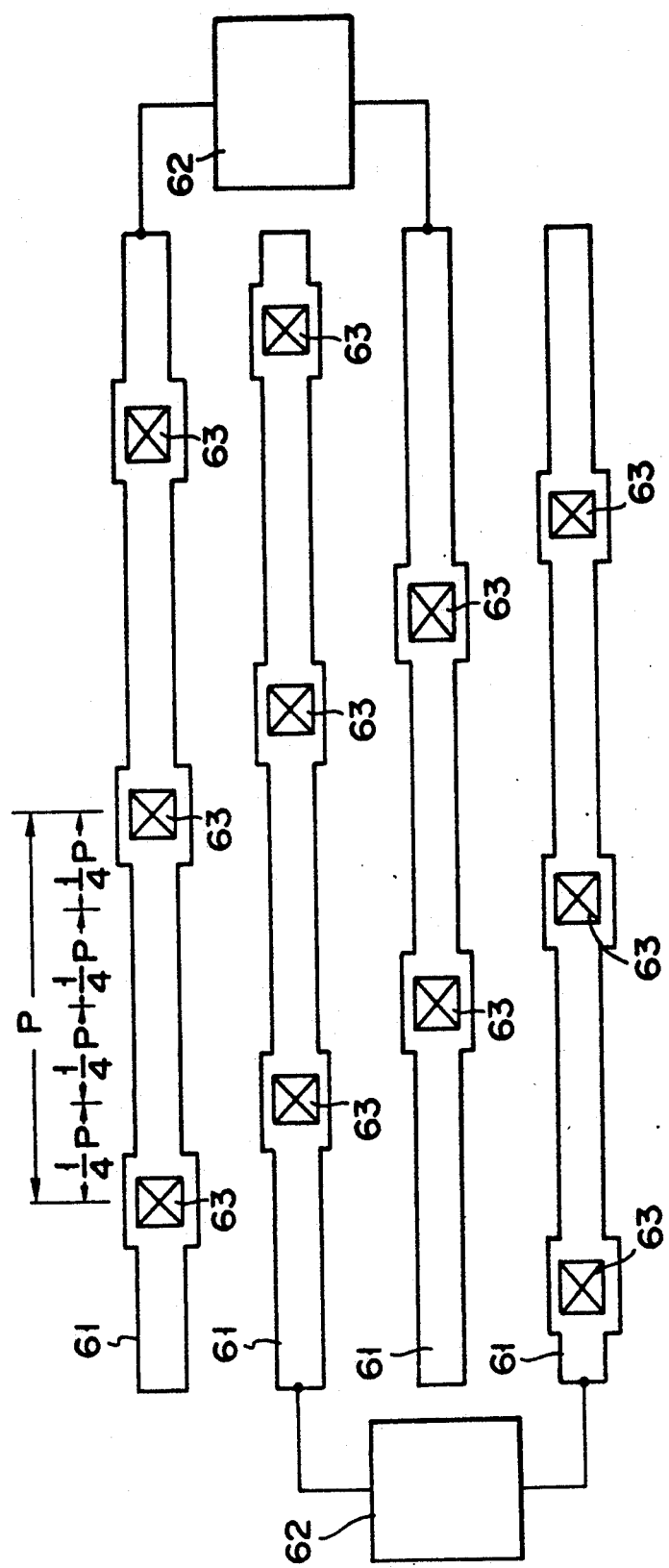
FIG. 1 is a plan view showing part of a cell array pattern of a semiconductor memory device according to one embodiment of the present invention.
Figure 2:
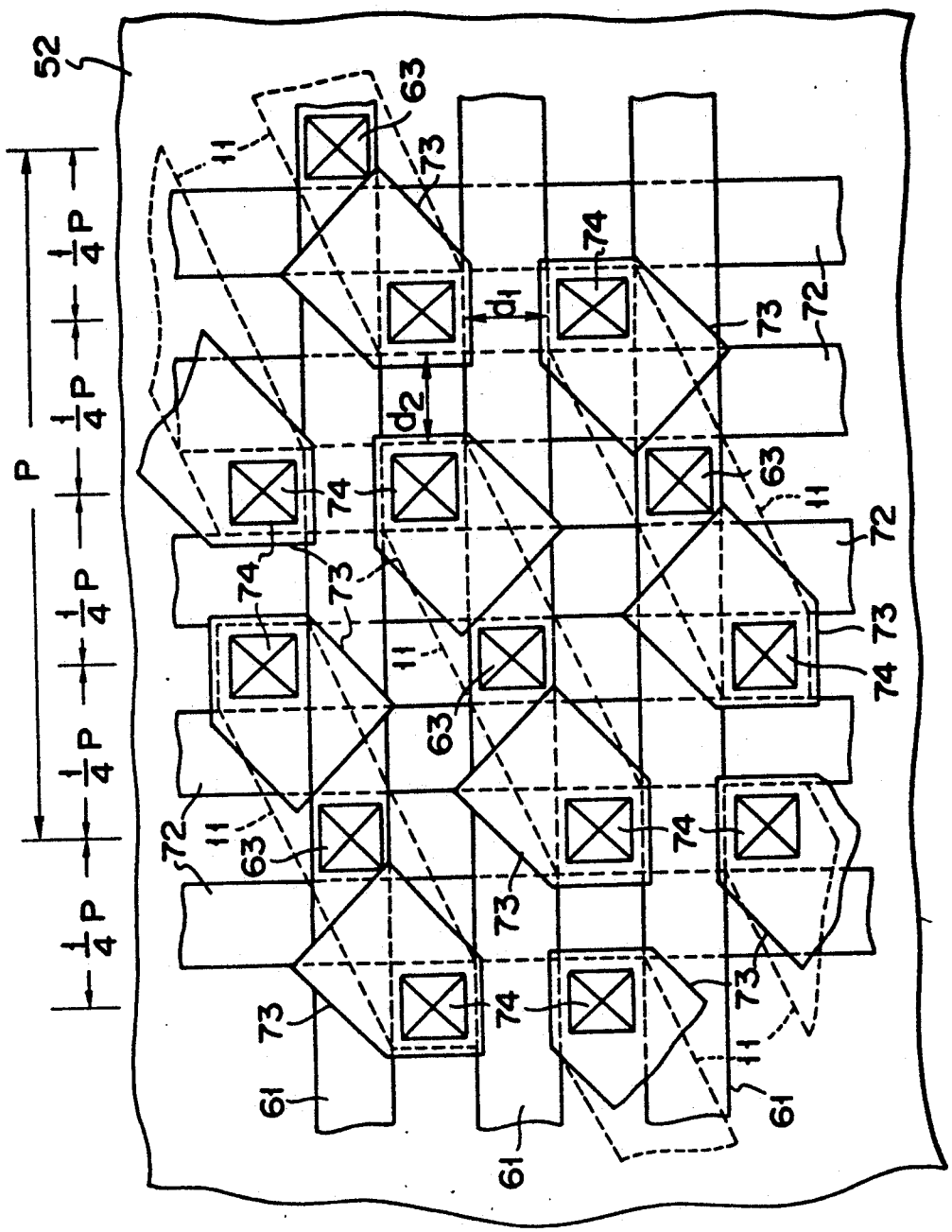
FIG. 2 is a plan view showing the part of the cell array pattern of FIG. 1 in detail.
Figure 8:
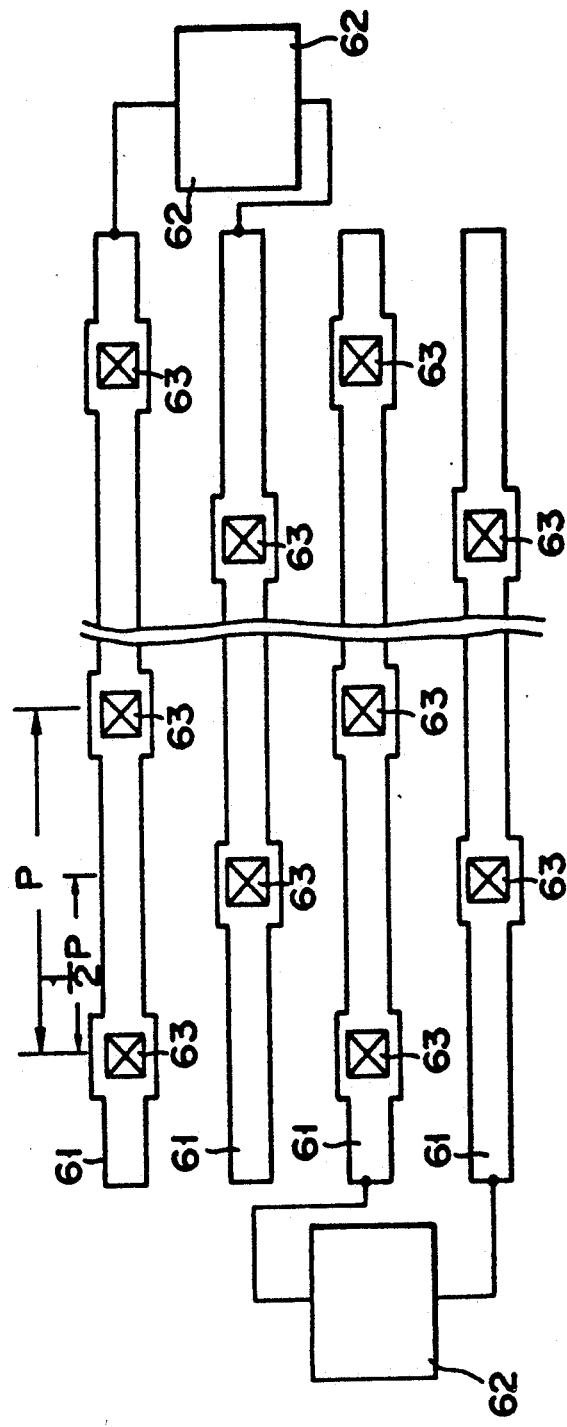
FIG. 8 is a plan view showing part of the cell array pattern in the conventional dynamic memory.
Figure 9:
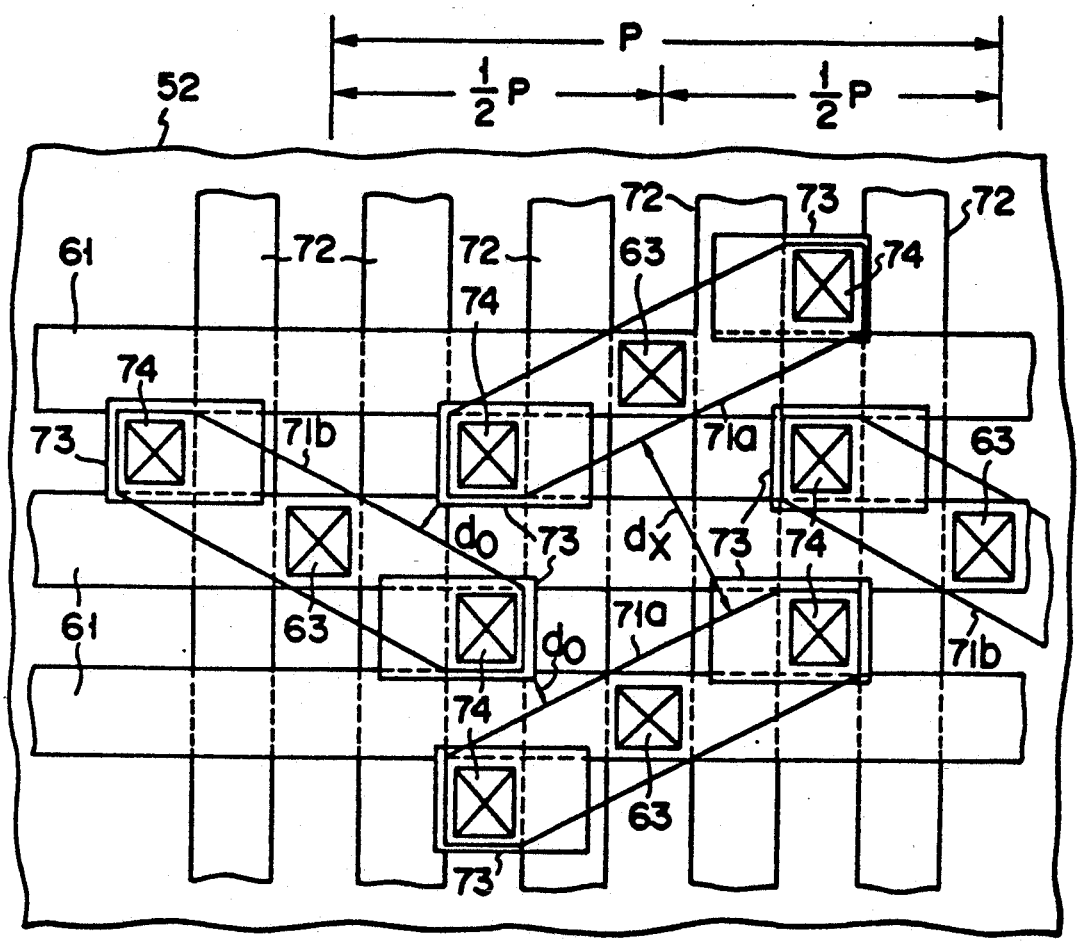
FIG. 9 is a plan view showing the part of the cell array pattern of FIG. 8.

A cell array pattern of dynamic memory cells shown in FIGS. 1 and 2 is similar to that of the conventional dynamic memory cells explained with reference to FIGS. 8 and 9 except that respective transistor contacts 63 of adjacent bit lines 61 are shifted by approximately $\frac{1}{n}$ (for example, $\frac{1}{4}$) pitch in the bit line direction, and that the patterns of cell regions 11 extend in the same direction (that is, the patterns of cell regions 11 are of one kind).

FIG. 1 shows part of the cell array pattern of folded bit line type as an example of a cell array pattern of dynamic memory cells with a one-transistor-one-capacitor structure in a dynamic memory. That is, in FIG. 1, 61 denotes bit lines arranged in parallel with one another, 62 denotes bit line sense amplifiers arranged at both ends of the bit lines 61. A sense amplifier 62 is successively connected to a complementary pair arrangement which includes adjacent bit lines 61 between which another bit line 61 is disposed. Each of the bit lines 61 has contacts 63, which are in contact with drain regions (or source regions) of cell transistors, at a regular interval of constant pitch P in its bit line direction. In this case, a distance between adjacent two contacts of the bit line is given as one pitch. The contacts 63 of the bit lines 61 are successively deviated from contacts 63 of an adjacent bit lines 61 by $\frac{1}{4}$ pitch in the bit line direction.

FIG. 2 shows part of the cell array pattern of FIG. 1 in detail. The bit lines 61 and word lines 72 are arranged in directions to intersect with each other, and each cell region 11 for two cell transistors is provided so as to be crossed by one desired bit line 61 and adjacent two word lines 72, respectively. In this case, the respective patterns of the cell regions 11 extend in the same direction, and one kind of the cell region patterns are repeatedly arranged as a whole. Further, each of the bit lines 61 is in contact with a common region of two cell transistors every desired pitch in its longitudinal direction at portions intersecting with cell regions 11. The two cell transistors are provided so as to include two capacitors, thereby providing two dynamic memory cells with one-transistor-one-capacitor structure per one cell region.

In a plurality of bit lines 61 arranged in parallel with one another, the transistor contacts 63 of one of the bit lines 61 are successively deviated by approximately $\frac{1}{4}$ pitch in the bit line direction from the corresponding transistor contacts 63 of another bit lines 61 which are adjacent to the first bit line 61. Further, a capacitor storage electrode 73 is provided for every memory cell and is in contact with a corresponding cell transistor. The capacitor storage electrode 73 has an elongate pattern which overlaps the intersection of one bit line 61 and one word line 72. In FIG. 2, 74 denotes contacts between the source regions 43 or 44 of the cell transistors and the capacitor storage electrodes 73.

Figure 3:
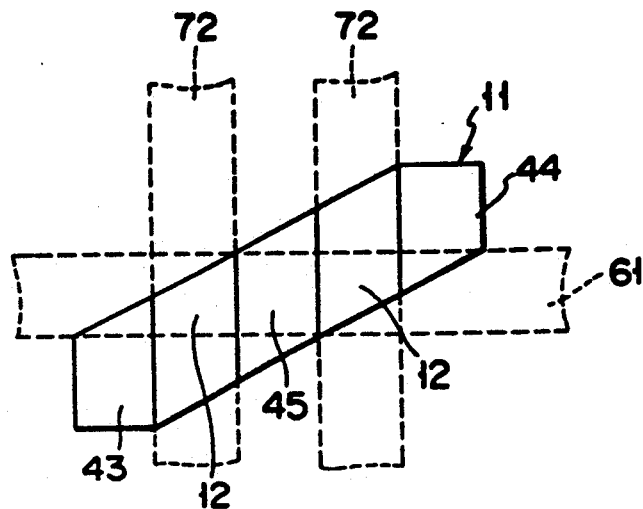
FIG. 3 is a plan view showing a pattern of source, channel and drain regions of a cell transistor pair in a cell region in FIG. 2.

FIG. 3 shows a pattern of the source regions 43 and 44, channel regions 12 and drain region 45 of the cell transistor pair in the cell region 11 shown in FIG. 2.

Figure 4:
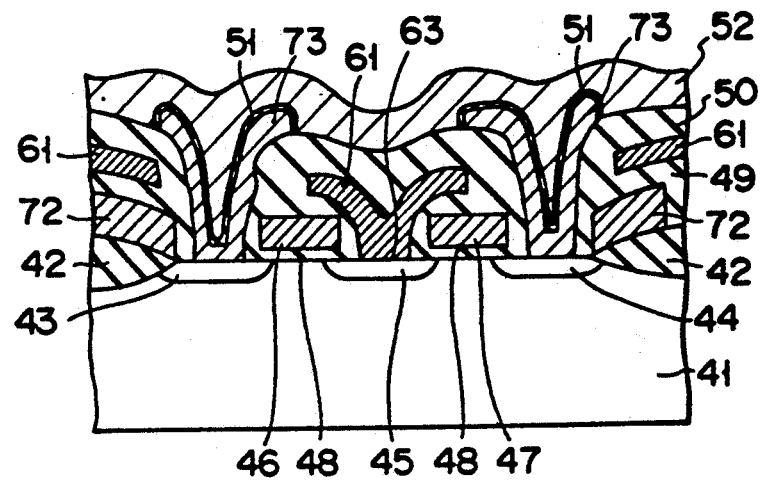
FIG. 4 is a cross-sectional view of the memory cell region of FIGS. 2 and 9.

FIG. 4 shows the cross section of the memory cell region of FIG. 2. In the drawing, 41 denotes a semiconductor substrate, 42 denotes a field insulating film for cell isolation selectively formed in the substrate, 43 and 44 denote the source regions of first and second cell transistors which are formed of diffused regions of a conductivity type opposite to that of the substrate, 45 denotes the common drain region of the first and second cell transistors which is formed of a diffused region of a conductivity type opposite to that of the substrate, and 46 and 47 denote the gate electrodes of the first and second cell transistors which are disposed on a thin gate insulating film 48 provided on the substrate 41 and which are part of the word lines 72, respectively. Further, 49 denotes a first interlevel insulator, 61 denotes the bit lines, and 63 denotes the transistor contact which is in contact with the drain region 45 through a contact hole, respectively. 72 denotes the word lines and 50 denotes a second interlevel insulator.

The first and second cell transistors include a charge storage capacitor, respectively. That is, capacitor storage electrodes denoted by 73 are partly disposed on the second interlevel insulator 50 so as to be located above part of the upper portion of the bit lines 61, and are in contact with the source regions 43 and 44 of the cell transistors through contact holes, respectively. A capacitor plate electrode 52 is provided so that the capacitor storage electrode 73 are faced through a thin capacitor insulating film 51, thereby providing a stacked capacitor.

According to the cell array pattern described above, the cell regions 11 cross word lines 72 and extend so that the longitudinal axis of each cell is parallel to the longitudinal axis of each other cell. Furthermore, the axes may cross the lines in a non-perpendicular fashion. In this case, the integration density of the cell regions 1 is determined by the minimum distance d1 between the adjacent patterns in the word line direction or by the minimum distance d2 between the adjacent patterns in the bit line direction, and since a distance between adjacent patterns, which are deviated from each other by approximately $\frac{1}{4}$ pitch in the bit line direction, is reduced to of the order of the minimum distance d1 or d2, the density of the cell regions I1 can be increased, thereby further increasing the integration density thereof. Furthermore, a capacitor storage electrode 73 with increased area is provided. In addition, since the capacitor storage electrode 73 overlaps adjacent bit and word lines 61 and 72, unwanted stray capacitance between the bit lines 61 is minimized.

Figure 5:
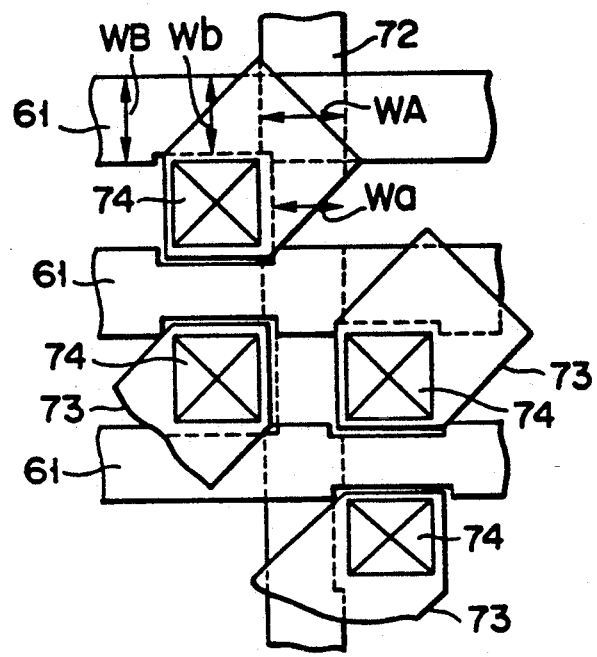
FIG. 5 is a plan view showing a modified example of word and bit line patterns near contacts of FIG. 2.

In order to obtain the sufficient area of each contact in the above embodiment, particularly, the sufficient area of each contact 74 between the source region 43 or 44 of the cell transistor and the capacitor storage electrode 73, the word line width Wa near the contact 74 may be made narrower than the word line width WA of the other portion thereof as shown in FIG. 5. Likewise, the bit line width Wb near each contact 74 may be made narrower than the bit line width WB of the other portion thereof.

Further, in the above embodiment, part of the capacitor storage electrode 73 is provided above part of the bit line 61, but it may be located below part of the bit line 61.

Next, another embodiment of the invention will be described.

Figure 6:
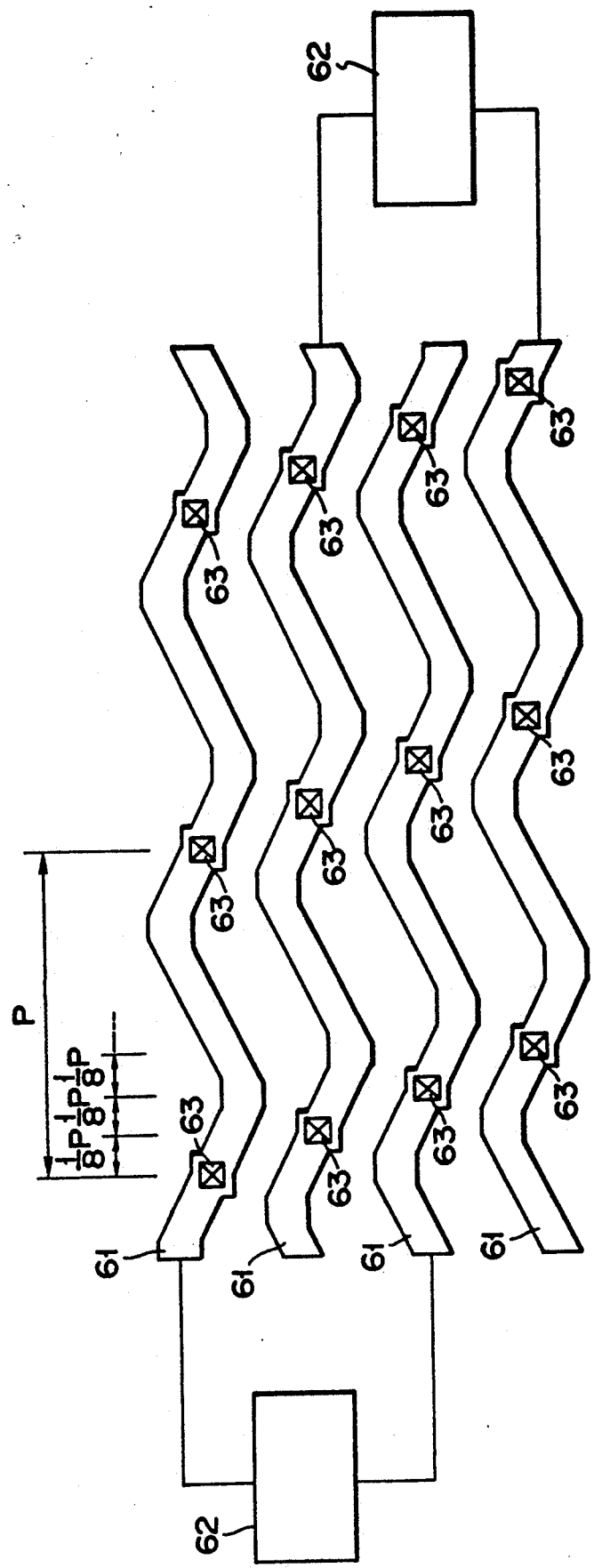
FIG. 6 is a plan view showing part of a cell array pattern of a semiconductor memory device according to another embodiment of the present invention.
Figure 7:
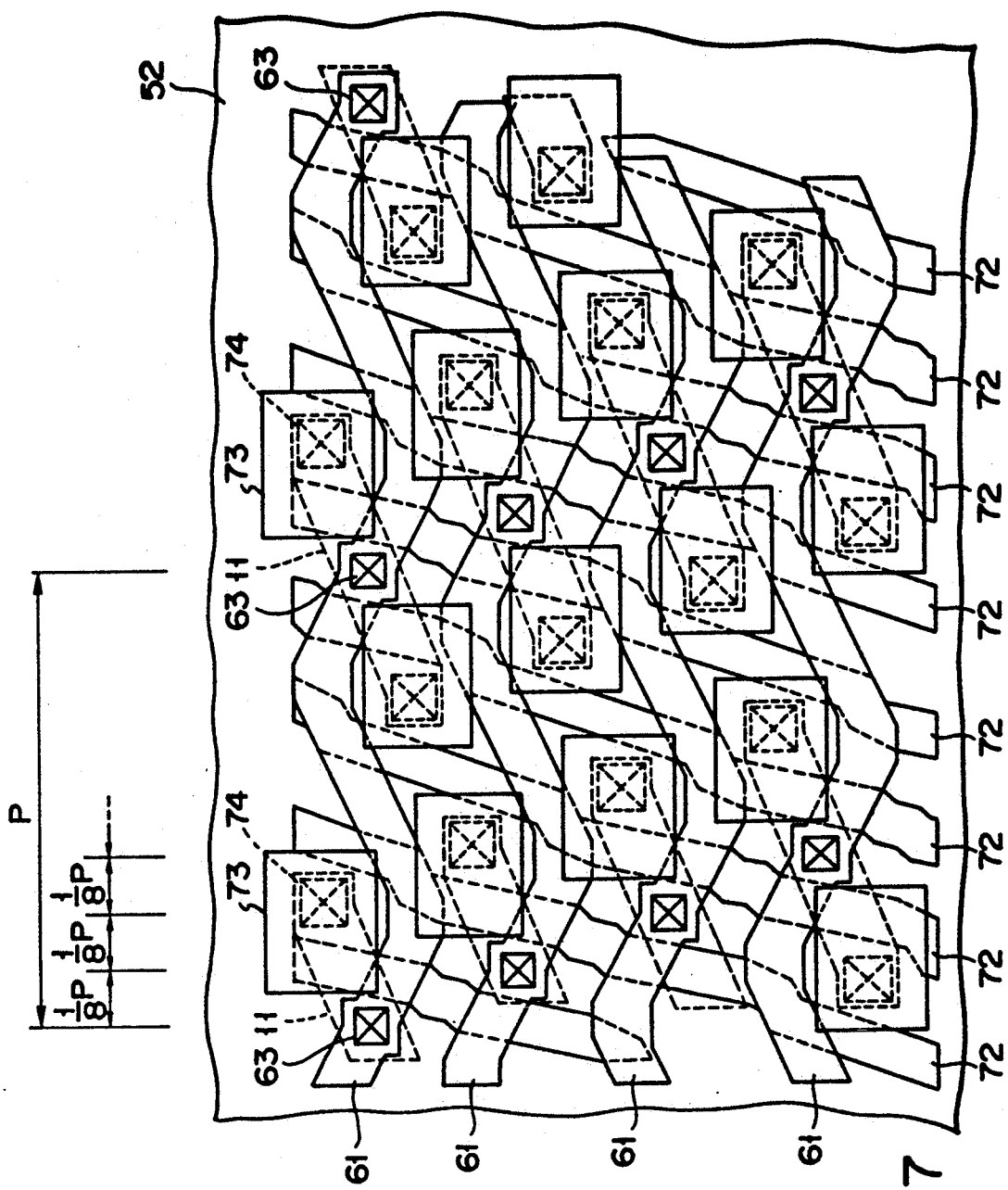
FIG. 7 is a plan view showing the part of the cell array pattern of FIG. 6.

FIGS. 6 and 7 show a cell array pattern of folded bit line type dynamic memory cells in which contacts of the adjacent bit lines are deviated from one another by ⅓ pitch, and the same parts or components as those of FIG. 2 are denoted by the same reference numerals.

As shown in FIG. 6, a sense amplifier 62 is successively connected to both ends of bit lines which provide a complementary pair arrangement which includes adjacent bit lines 61 between which another bit line 61 is disposed. Each of the bit lines 61 has contacts 63, which are in contact with drain regions (or source regions) of cell transistors, at a regular interval of constant pitch P in its bit line direction. In this case, the contacts 63 of the bit lines 61 are successively deviated from contacts 63 of adjacent bit lines 61 by ⅓ pitch in the bit line direction.

FIG. 7 shows part of the cell array pattern of FIG. 6 in detail.

As is the first embodiment of FIG. 2, in FIG. 7, the word lines 72 are insulatively disposed above the cell regions 11 formed in the semiconductor substrate, and the bit lines 61 are insulatively formed over the word lines. Also, the cell regions 11 are arranged to extend in the same direction. Each of the bit lines 61 are electrically connected to common regions of transistor pairs in cell regions 11 via the contacts 63, respectively. In this embodiment, the contacts 63 of adjacent bit lines 61 are deviated by ⅓ pitch in the bit line direction from one another. An insulating film (not shown) is formed to cover the bit lines, and the capacitor storage electrodes 73 are provided on the insulating film. The storage electrodes 73 are connected to the source regions of corresponding cell transistors via the contacts 74. Further, capacitor plate electrodes 52 are disposed to face the storage electrodes 73 via an insulating film.

As described above, in this embodiment, the basic structure is the same a that of the first embodiment except that the contacts 63 of the adjacent bit lines 61 are deviated from one another by ⅓ pitch in the bit line direction, and the pattern density of the cell regions can be further increased. Furthermore, as seen in FIG. 6, bit lines 61 may be arranged in a wave-like pattern, with each successive bit line "phase-shifted" from its adjacent bit line by an amount corresponding to the contact pitch shift. Similarly, as seen in FIG. 7, word lines 72 may be arranged in a wave-like pattern which also shifts with each successive word line. The word lines may be arranged in a non-perpendicular manner to the bit lines.

Further, this invention is not limited to the dynamic memory devices having the folded bit line type cell array pattern as described in the above embodiments, but can be applicable to dynamic memory devices using open bit line type cell array patterns.

It is further understood by those skilled in the art that the foregoing description is preferred embodiments of the disclosed devices and that various changes and modifications may be made in the invention without departing from the sprit and scope thereof.

What is claimed is:

1. A semiconductor memory device comprising:
   a semiconductor substrate;
   a plurality of bit lines arranged on said semiconductor substrate and generally extending in a first direction;
   a plurality of word lines arranged on said semiconductor substrate and generally extending in a second direction so as to intersect said bit lines;
   a plurality of cell regions formed on said semiconductor substrate, each of said cell regions extending so as to be crossed by one of said bit lines;
   a plurality of memory cell pairs formed in each of said cell regions and having a common contact coupled to the bit line crossing the associated cell region, wherein each of said cell regions has a same pattern arranged at an angle with respect to said first direction.

2. The semiconductor memory device according to claim 1, further comprising a plurality of sense amplifiers are arranged on said semiconductor substrate at both ends of said bit lines.

3. The semiconductor memory device according to claim 2, wherein said sense amplifiers are each coupled to ends of two of said bit lines so as to provide a complementary pair arrangement.

4. The semiconductor memory device according to claim 1, wherein two adjacent common contacts of any one of said bit lines are separated by a predetermined pitch and the common contacts of a first bit line are shifted by approximately $\frac{1}{2^n}$ pitch along said first direction from the common contacts of a second adjacent bit line, wherein n is a natural number greater than or equal to 2.

5. The semiconductor memory device according to claim 4, wherein n is equal to 2.

6. A semiconductor memory device comprising:
   a semiconductor body;
   M bit lines arranged on said semiconductor body;
   N word lines arranged on said semiconductor body to intersect said bit lines;
   a first memory cell pair provided on said semiconductor body and having a first contact between an n and an (n+1) word line and an (m+1) bit line, a second contact between an (n+2) and an (n+3) word line and the (m+1) and (m+2) bit line, and a third contact at the (m+1) bit line;
   a second memory cell pair provided on said semiconductor body and having a first contact between the (n+2) and the (n+3) word line and the (m+2) and an (m+3) bit line, a second contact between an (n+4) and an (n+5) word line and the (m+3) and an (m+4) bit line, and a third contact at the (m+3) bit line;

a third memory cell pair provided on said semiconductor body and having a first contact between the (n+3) and the (n+4) word line and the (m+1) and the (m+2) bit line, a second contact between the (n+5) and an (n+6) word line and the (m+2) and the (m+3) bit line, and a third contact at the (m+2) bit line, wherein the distance between said third contact of said second memory cell pair and said first contact of said third memory cell pair is greater than that between said second contact of said first memory cell pair and said first contact of said second memory cell pair.

* * * * *